(12) United States Patent
Iwasaki

(10) Patent No.: US 6,558,168 B2
(45) Date of Patent: May 6, 2003

(54) PROBE CARD

(75) Inventor: Yukoh Iwasaki, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/782,110

(22) Filed: Feb. 13, 2001

(65) Prior Publication Data

US 2002/0009904 A1 Jan. 24, 2002

(30) Foreign Application Priority Data

Feb. 15, 2000 (JP) .................................... 2000-036626

(51) Int. Cl.[7] .................................................. H01R 21/302
(52) U.S. Cl. ..................................... 439/63; 324/754
(58) Field of Search ............................. 439/55, 63, 581, 439/482; 324/762, 754, 72.5; 361/760

(56) References Cited

U.S. PATENT DOCUMENTS 5,751,554 A * 5/1998 Williams et al. ............. 361/760
5,933,017 A * 8/1999 Bessho et al. ............... 324/754
6,034,533 A * 3/2000 Tervo et al. .................. 324/762

FOREIGN PATENT DOCUMENTS

| JP | 64-47042 | 3/1989 |
| JP | 08-279314 | 10/1996 |
| JP | 08-330369 | 12/1996 |
| JP | 08-335754 | 12/1996 |
| JP | 11-044709 | 2/1999 |

* cited by examiner

Primary Examiner—Renee Luebke
Assistant Examiner—Phuongchi Nguyen

(57) ABSTRACT

The present invention provides a probe card comprising a substrate and an external connection terminal located on substrate, wherein external connection terminal 1 is separated from a body of substrate by conductors attached to the substrate, whereby the waiting time due to dielectric absorption can be constantly shortened, and the steady-state leakage current can be stably reduced, thereby enhancing the accuracy of measuring microcurrents and determining microcurrent fluctuations for semiconductor wafer testing devices.

3 Claims, 5 Drawing Sheets

PROBE CARD

BACKGROUND OF THE INVENTION

1. Field of the Invention

The present invention relates to a probe card for connecting a wafer to be measured with a measuring device in a semiconductor wafer testing device.

2. Description of the Related Art

Marked progress has been seen in the recent semiconductor manufacturing technology, including the progress of fine processing technology required for high density integration. For high density implementation as well as for suppression of heat generation and downsizing each elements, the current and voltage required for operation in the semiconductor devices are reduced year by year. Thus, the importance of microcurrent measurement has been recognized, and higher accuracies in microcurrent measurement are required in probe cards for connecting measuring devices and wafers.

Such a requirement is also present in the wafer process control testing. As a conventional testing method for process control, measurement chips referred to as TEG (Test Element Group) are formed at the same time as ordinary chips are formed on wafers for characteristic measurements. In such measurement, a probe card is used as an interface card between a measuring device and a wafer prober for moving and positioning a wafer to be measured, and is provided around its circular hole with a plurality of wafer contact needles also referred to as contact blades so as establish contacts with measuring terminals of the wafer.

In FIG. 10, a probe card is generally a circular disk 100 having a diameter from about 20 to 30 cm, with its central portion provided with an opening 102 through which contact needles or blades (not shown) can extend to contact with measuring terminals on a semiconductor wafer placed to be measured just under the probe card. Each wire 103 extends from each needle or blade located at the inner periphery toward the outer periphery where it is connected to a measuring device or the like. That is, a signal picked up from each terminal of a semiconductor wafer to be measured is introduced into the outer periphery of the probe card via each needle or blade, and is then sent to a measurement device from an external connection terminal 104 located on the outer periphery of the probe card. At that time, wires for connecting the semiconductor wafer to be measured with the measuring device are several tens in number and placed adjacent to one another. Guard patterns 105 formed with a conductor are located around the corresponding external connection terminals 104. In the example shown in the drawing, the number of external connection terminals or pins is forty eight (48). Such a probe card is also known as a personality board or interface card. See Japanese Utility Model Provisional Publication (JP-A) No. Showa 64-47042, and Japanese Patent Provisional Publication (JP-A) No. Heisei 8-330369.

In general, such a probe card has external contact terminals 104 at its outer periphery for connection with a measuring device. Each contact terminal 104 is composed of a planar conductor provided on a substrate surface of the probe card, on which, for example, a conductor contact needle, such as a contact pin member which comprises a conductive rod with a circular cross-section provided with a spring at its base and surrounded by a cylindrical member such that on application of appropriate force the rod is retracted and biased by a reaction force so as to establish electrical contact by pushing the tip of the rod against a conductor surface, with a mechanism to provide secured electric contact is pushed against the planar conductor surface of the probe card, thereby to connect with an external apparatus such as a measuring device. Further, each external contact terminal 104 has a pattern extension portion 106 near its inner periphery, and a corresponding planar conductor on the surface of the probe card extends inwardly. To the pattern extension portion one end of a coaxial cable 103 is connected, and the other end of the coaxial cable is connected with a base end of a contact needle which has the shape of the needle or blade as described above. Namely, the coaxial cable 103 extends in the air between the pattern extension portion and the contact needle. The needle or blade is attached to the inner periphery of the probe card and extends inwardly therefrom. Further, the tip of the needle or blade extending inwardly is connected to a predetermined terminal on a semiconductor wafer to be tested.

As mentioned above, in the field of testing semiconductor elements, testing appliances which can measure microcurrents smaller than the currently used level are required. Also, the measuring accuracy of femtoampere order is required for interface cards used for wafer probers. Major problems on developing testing devices with such high performance include leakage current between adjoining electric wires for connecting a testing device and a semiconductor to be measured and dielectric absorption occurring between such wires and dielectrics in a probe card substrate.

For example, the problem of dielectric absorption occurs due to dielectric absorption properties (absorption current) of the dielectric used as the probe card substrate. Generally, insulating materials show dielectric polarization when a voltage applied across two electrodes changes, and absorb a current gradually until the polarization process is completed. Therefore, even if a predetermined voltage is applied to a semiconductor wafer for current measurement, the current measurement can not be performed correctly for a certain time period and a waiting time is necessary until the current flow becomes stabilized. A waiting time is also necessary when the voltage supply is terminated because a discharge current flows out gradually. For conventional interface cards for wafer probers, it is not unusual that such a waiting time for measurement may be several tens of seconds until the dielectric absorption current is reduced to a femtoampere order. This is one of important problems in case of reducing the time required for the microcurrent measurement.

As the measuring accuracy of a femtoampere order is now required, the leakage current flowing through a dielectric material between adjoining wires has also become important.

Among the components on the probe card as mentioned above, portions of the external contact terminal and the pattern extension portion tend to be affected by the dielectric absorption and current leakage. The coaxial cable extending from each pattern extension portion runs in the air so that it is little influenced by the dielectric absorption or current leakage. As the needle portion, for example, a coaxial highly insulating needle can be used, and a shield wire surrounding the core wire of this needle can be connected with a guard. In addition, insulation between adjoining needles having a portion of the needle wire not covered with the shield wire is good because it is achieved by air which has the same dielectric constant approximately as that of vacuum. Also, the response time of the dielectric polarization is not an issue.

To address these problems caused by the external contact terminal, conventionally, a plurality of through-holes are formed from electrodes on the surface through the probe card substrate such that the periphery of the electrodes can be defined. One example of such technologies is described in Japanese Patent Provisional Publication No. Heisei 8-335754.

One problem in such a method is that a distortion tends to occur in the probe card as the number of through-holes is increases, and that the physical strength of the card degrades in or near the region of the through-holes. Even if the number of the through-holes is increased regardless of manufacturing difficulties and cost elevation, some leakage current through the dielectric between these through-holes still remains as a problem, and a dielectric loss can not be reduced to a desired level as a higher level of measuring accuracy is required.

It has been noted that there are variations in the dielectric and leakage current properties of each wire for each probe card. Therefore, even if the manufacturing process control is improved sufficiently, such variations in the dielectric and current leakage properties of each wire for each probe card would limit the accuracy of current measurements. For example, in case of a currently used probe card with 48 pins after application of a voltage of about 10 volts, the leakage current 10 seconds after that voltage application of most pins is about $0.3 \times 10^{-13}$ A. However, such a leakage current of other specific pins becomes about 1 to $2 \times 10^{-13}$ A.

SUMMARY OF THE INVENTION

It is an object of the present invention to reduce a measuring waiting time resulted from dielectric absorption and decrease a steady-state leakage current so as to enhance accuracy of measuring microcurrents or fluctuations of them. It is another object of the present invention to reduce variations of properties of each pin or each probe card.

In light of the problems described above of the prior art, the present invention relates to a structure in which an external connection terminal for use in a probe card is surrounded by conductors.

The present invention provides a probe card which comprises a substrate and an external connection terminal disposed on the substrate, wherein the external terminal is separated from a substrate body via conductors attached to the substrate.

The conductors surrounding the external connection terminal in the present invention is preferably connected to a guard terminal, more preferably to an active guard terminal.

The conductor attached to the substrate surrounds the external connection terminal in the substrate. Assuming that the conductor has a box-like configuration, the bottom face of the conductor is located below the external terminal in the substrate, and the four side faces are located in the substrate and surround the external connection terminal from all quarters. The term "in the substrate" does not necessarily mean that the conductor is embedded in the substrate. That is, at least a portion of each conductor should appear from the substrate surface and may protrude therefrom. Further, when the substrate surface is recessed or notched, the conductor may be exposed in the recessed or notched portions of the substrate or protrude in the air.

In such a construction of the present invention, the microcurrent properties of femtoampere order can be enhanced so that the measuring accuracy can be improved. The waiting time resulted from the instability of the current due to the dielectric absorption can also be reduced. In addition, the substrate can include other electrical networks which could not be included in the substrate so far because of their possibility of degrading the microcurrent properties. Because the probe card of the present invention can be made in general in a planar structure (although it can have three-dimensional structures), it can be handled easily and reduce the cost for storage or transportation. Moreover, the present invention is compatible with currently available probe cards.

The substrate may have a mono-layered structure, but preferably it has a multi-layered structure. In a preferred embodiment, for example, conductive wires can be provided among layers, and via-holes or through-holes can be formed in a multi-layered substrate by one of commonly known technologies for manufacturing multi-layered substrates.

The probe card of the present invention can be manufactured in accordance with the following procedure,while it is not limited by any manufacturing processes. The external connection terminal surrounded by conductor can be produced, for example, by forming a recess in a substrate, providing a box-like external connection terminal portion in which an external connection terminal is formed on the top surface, and a conductor material is disposed on the side surfaces by plating or the like, and fitting the box-like external connection terminal portion in the recess. Alternatively, the external connection terminal can be produced by forming a recess in a substrate, disposing a conductor material in the recessed portion by plating or the like, and fitting or adhering in that recess a member composed of a box-like dielectric and an external connection terminal provided thereon. Otherwise, in case of a multi-layered substrate, the external connection terminal surrounded by conductors can be produced by placing a conductor pattern on an inner layer located below the external connection terminal, cutting a pattern surrounding the terminal and reaching the inner layer after lamination, and applying a conductor material into the cut pattern.

DETAILED DESCRIPTION OF THE PREFERRED EMBODIMENTS

Figure 1:
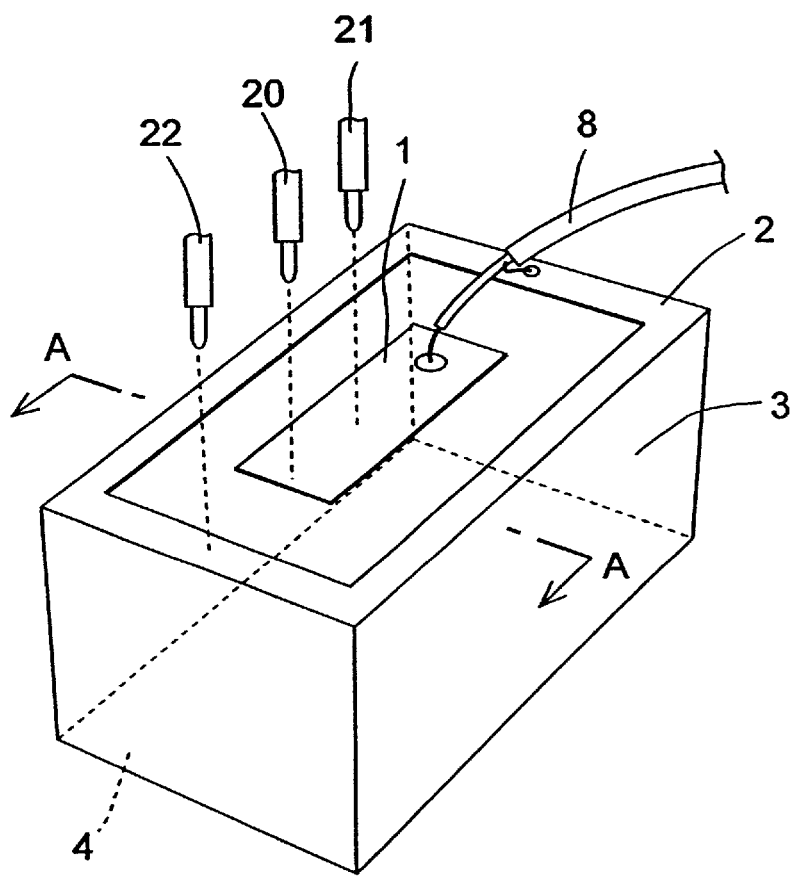
FIG. 1 is a perspective view of a fundamental embodiment of the present invention with substrate portions around side and bottom conductors being eliminated.

Several embodiments of the present invention will be described with reference to FIGS. 1 to 9. FIG. 1 shows a fundamental embodiment of the present invention. In the same drawing surrounding substrate portions are eliminated to show external connection terminal 1 and a conductor material, including upper guard pattern 2, side conductors 3, and bottom conductor 4 placed around it. The conductor material 2, 3, 4 is electrically connected and equipotential to one another. On the substrate, the external connection terminal 1 and the upper guard pattern 2 surrounding the terminal 1 can be seen, both of which are composed of conductor. Over the external connection terminal 1 and the upper guard pattern 2, three contact pin members 20, 21, 22 projecting from a test head of a semiconductor measuring device are positioned so as to contact with their corresponding targets. In this embodiment, the contact pin member 20 is a so-called "force" terminal for applying a voltage and measuring a current, the contact pin member 21 is a "sense" terminal for picking up a voltage to be measured. These force and sense terminals provide a Kelvin connection. The contact pin member 22 is a guard terminal for applying a voltage to the upper guard pattern 2. The contact pin member 22 functions as a guard terminal in an active guard mechanism in which it is held equipotential to the force and sense terminals to block external influences on the external connection terminal or in a passive guard mechanism in which it is connected to a fixed voltage. The present invention is applicable to both active and passive guard mechanisms. In FIG. 1, these force and sense terminals are placed over the same external connection terminal 1. However, two external connection terminals may be provided separately for the sense and force terminals, and each external connection terminal may be connected to a probe needle using a separate coaxial cable.

FIG. 1 shows external connection terminal 1 surrounded by the side conductors 3 and the bottom conductor 4. The side conductors 3 and the bottom conductor 4 are connected electrically to each other, and also connected to upper guard pattern 2. Ideally, the external connection terminal 1 is separated electromagnetically from a dielectric constituting the outer substrate via the side conductors 3 and bottom conductor 4. However, as will be described below, complete electromagnetic separation is not required for some specific embodiments of the present invention. A core wire of coaxial cable 8 for connection with a probe needle is connected to the external connection terminal 1, and the other external conductor of coaxial cable 8 is connected to the upper guard pattern 2.

Figure 2:
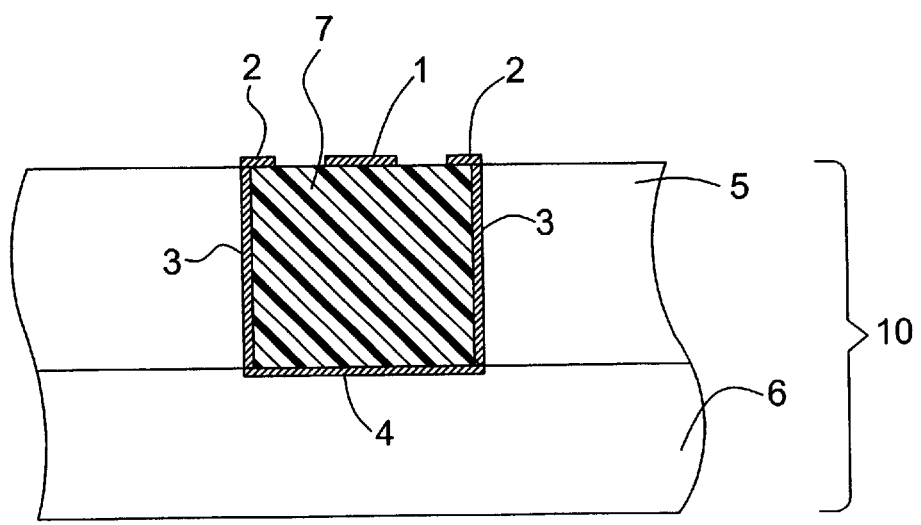
FIG. 2 is a cross-section taken along line A—A of FIG. 1.

FIG. 2 shows a cross-section taken along line A—A showing a cross-sectional view of the substrate 10. As shown in FIG. 2, the substrate is composed of two layers. The surface of the first layer 5 defines the surface of the substrate 10, and the bottom conductor 4 is provided between the first layer 5 and the second layer 6. This structure can be made by providing the conductor 4 using plating or the like on the bottom of the first layer 5 or the top of the second layer 6. The side conductor 3 can be formed using plating or the like on faces created by cutting away a portion of the first layer 5. Alternatively, the conductor can be formed by plating or the like on the side and bottom faces of the dielectric 7 to be fitted in the cut-away area in the first layer 5.

Examples of materials which can be used for making the substrate 10 include synthetic resins commonly used for substrates of electric circuits, for example, glass-fiber-reinforced polycarbonates, polyimides, glass-epoxy resins, and other stocks, such as ceramics. Examples of materials used for the dielectric to be fitted in the substrate for carrying the external connection terminal 1 thereon include synthetic resins similar to those used for the substrate 10 as well as materials with excellent insulating and dielectric properties, such as PTFE. It is also possible to make fine structures using materials other than those described above by application of the manufacturing technologies for producing integrated circuits and the micromachining technologies.

Figure 3:
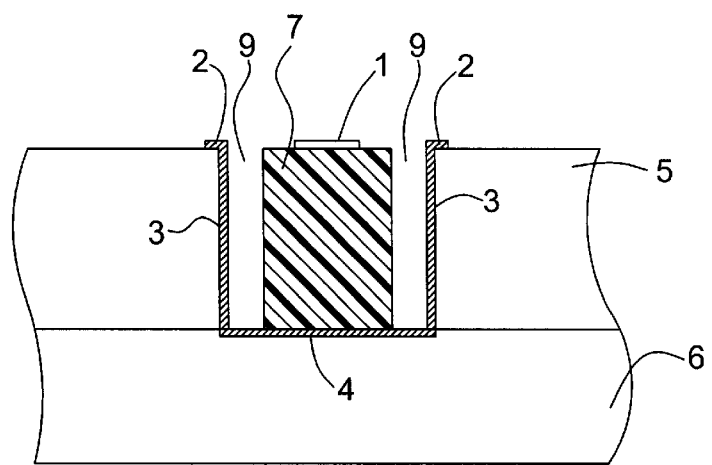
FIG. 3 is a cross-section corresponding to FIG. 2 showing another embodiment of the present invention.
Figure 4A:
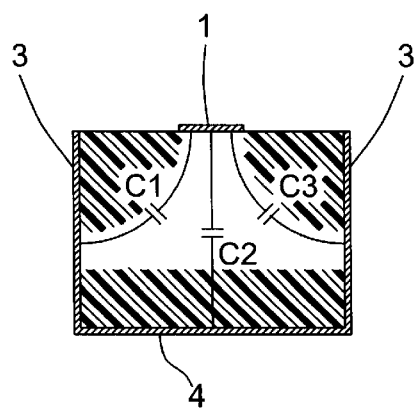
FIG. 4 is a schematic diagram for approximately determining capacitance between an external connection terminal and each side surfaces of an embodiment of the present invention.
Figure 4B:
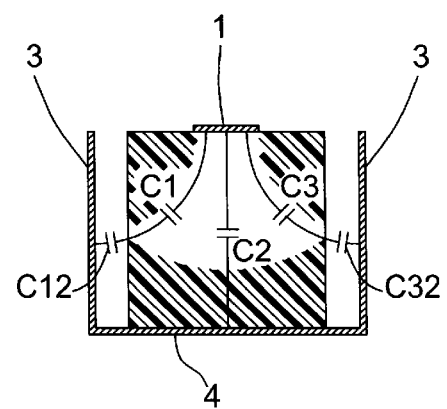

FIG. 3 shows another embodiment having a different cross-section from that of FIG. 2. In this embodiment, air gaps 9 are provided between the first layer 5 and the dielectric 7 carrying the external connection terminal 1 thereon. These gaps can greatly reduce capacitance between the external connection terminal 1 and the conductors 3, 4. In the configuration of FIG. 2, assuming that capacitance values $C1$ and $C3$ as shown in FIG. 4(A) between the external connection terminal 1 and the side conductor 3 on its right and left sides are 10 pF, respectively, and assuming that capacitance $C2$ between the terminal 1 and the bottom conductor 4 is 10 pF, the total capacitance becomes 30 pF as the sum of them. In case of providing air gaps 9 as shown in FIG. 4(B), capacitance values $C12$ and $C32$ corresponding to these gaps 9 can be considered to be about 1 pF, respectively. Thus, for example, capacitance $C1'$ between the left side conductor 3 and the external connection terminal 1 is 0.9 pF as obtained by the following equation:

$$C1'=C12*C1/(C12+C1)=0.9 \text{ pF}$$

Accordingly, the total capacitance is about 11.8 pF as obtained by $C1'+C2+C3'$ ($C3'$ is the capacitance between the right side conductor 3 and the external connection terminal 1), thereby significantly reducing the total capacitance.

In the structures shown in FIGS. 1 to 3, each side conductor 3 may protrude from the surface of the substrate (not specifically shown). In such a structure, when the contact pin members 20, 21, 22 contact with the substrate surface, these pin members can not be seen from the outside, and an electromagnetic shield can be provided among these contact pin members.

Figure 5:
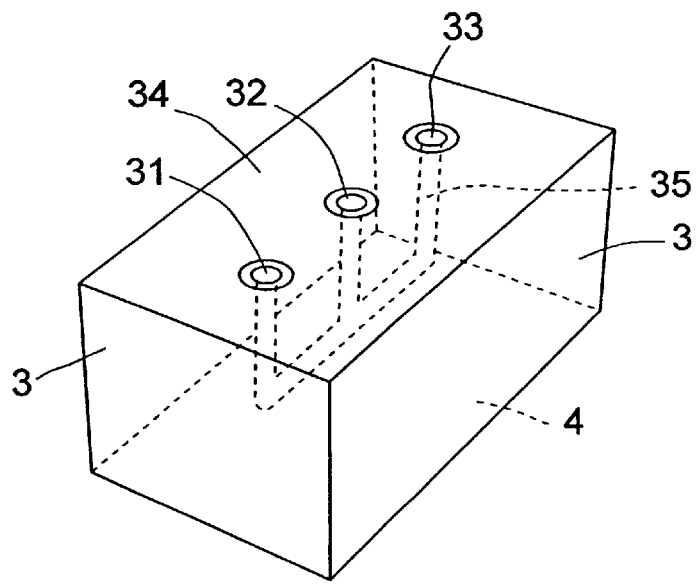
FIG. 5 is a perspective view of another embodiment of the present invention with substrate portions around side and bottom conductors being eliminated as shown in FIG. 1.

FIG. 5 shows another embodiment in which the external connection terminals 31, 32 can be seen only in areas where the contact pin members 20, 21 for connection with an external measurement device will be in contact with them. Connection between these terminals 31, 32 is provided by a conducting pathway 35 formed within the substrate. The terminal 33 can provide connection to a probe needle via a coaxial cable. In this embodiment, higher shielding properties can be obtained by forming a conductive pattern 34 which serves as an upper guard just near the periphery of external connection terminals 31, 32, 33. Thus, the contact pin member 22 for measuring a guard potential can contact with an upper shield 34. Further, the connection to a probe needle via a coaxial cable 8 can be replaced by a shielded conductive pathway formed in the substrate.

Figure 6A:
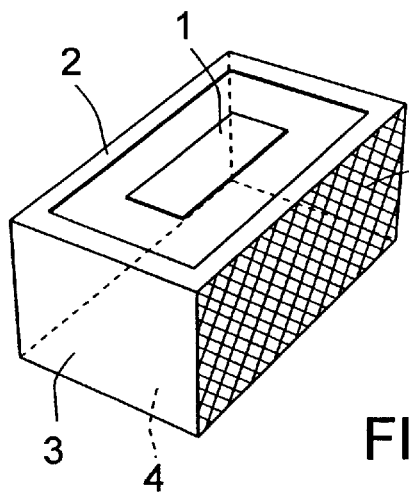
FIG. 6 is a perspective view corresponding to FIG. 5 showing yet another embodiment of the present invention.
Figure 6B:
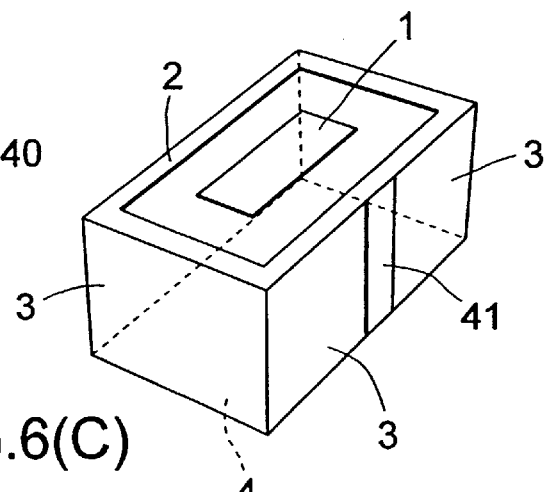
Figure 6C:
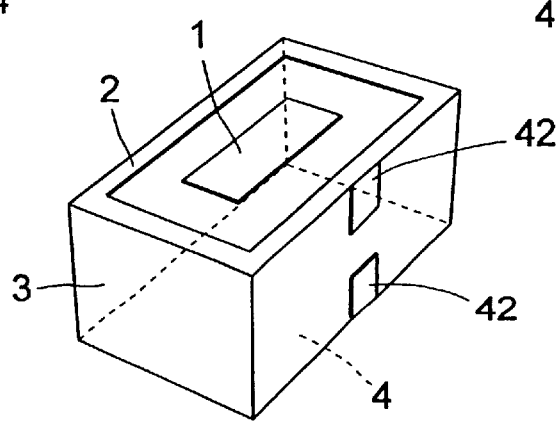

A partly or entirely meshed portion 40, cut portions 41, and notched portions 42 in the side conductor 3 are shown in FIG. 6(A) to FIG. 6(C), respectively. The conducting pathway 35 inside the substrate as shown in FIG. 5 can be disposed through cut portions 41 or notched portions 42 from the outside of the support structure of the external connection terminal 1. In another embodiment of the present invention, one of the side surfaces corresponding to the side conductors 3 of the dielectric carrying the external connection terminal 1 thereon may be opened in place of covering all the surfaces including the bottom face with conductor. Such a structure is preferred for ease of manufacturing and flexibility of designing.

Figure 7:
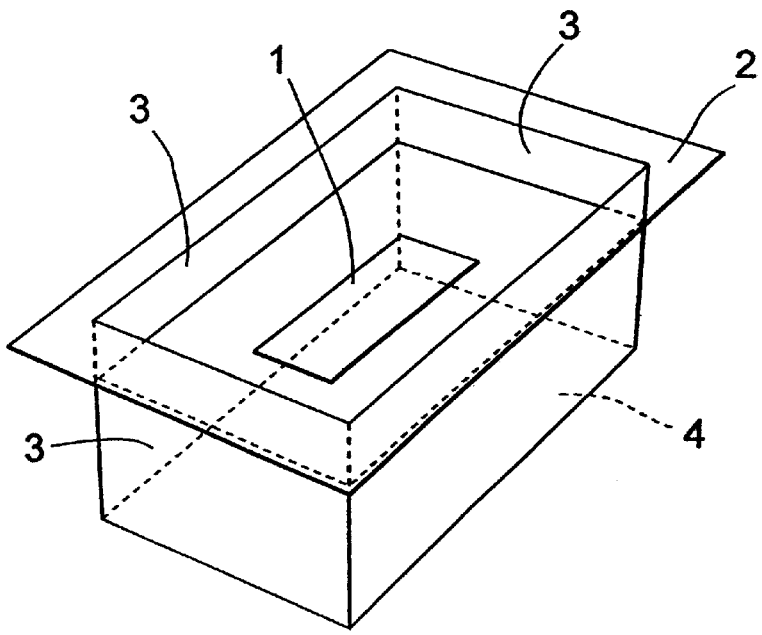
FIG. 7 is a perspective view showing yet another embodiment of the present invention.

In FIGS. 1 to 3, substrates 10 with a two-layered structure are shown as an example. Substrates having three or more layered structures, however, can be also applied to the present invention, and it is possible to use more complex structures utilizing substrates with a number of layers. In one example of such cases, it is possible to provide a structure in which the external connection terminal 1 is positioned lower than the surface of the substrate 10 as shown in FIG. 7. In FIG. 7, four side faces of the substrate 10 are trimmed leaving the upper guard pattern 2. The level of the external connection terminal 1 is lowered, while the side conductor 3 on the wall surfaces of the substrate 10 around the external connection terminal 1 protrude therefrom. Thus, when the contact pin members 20, 21 touch the terminal 1, the side conductors 3 serve as an electromagnetic shield for the contact pin members 20, 21 to prevent dielectric absorption due to potential differences between components of adjoing external connection terminals and the pin members.

Figure 8:
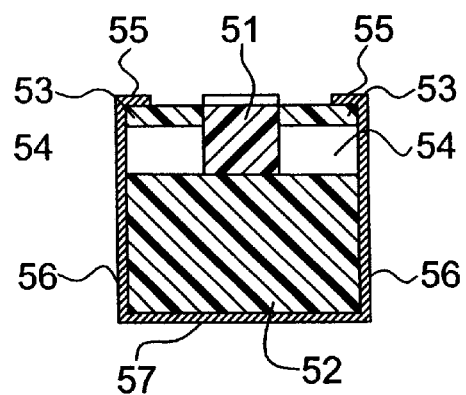
FIG. 8 is a cross-section of an embodiment in which gaps are provided within a substrate of the present invention.
Figure 9:
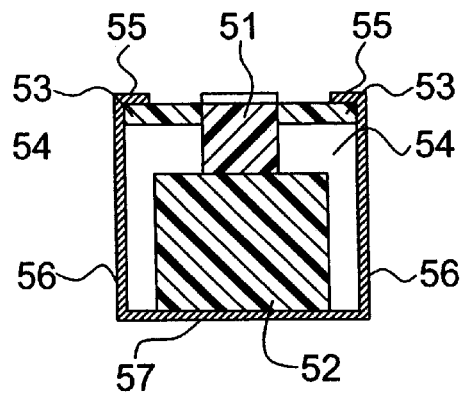
FIG. 9 is a cross-section of another embodiment in which gaps are provided within a substrate of the present invention.
Figure 10:
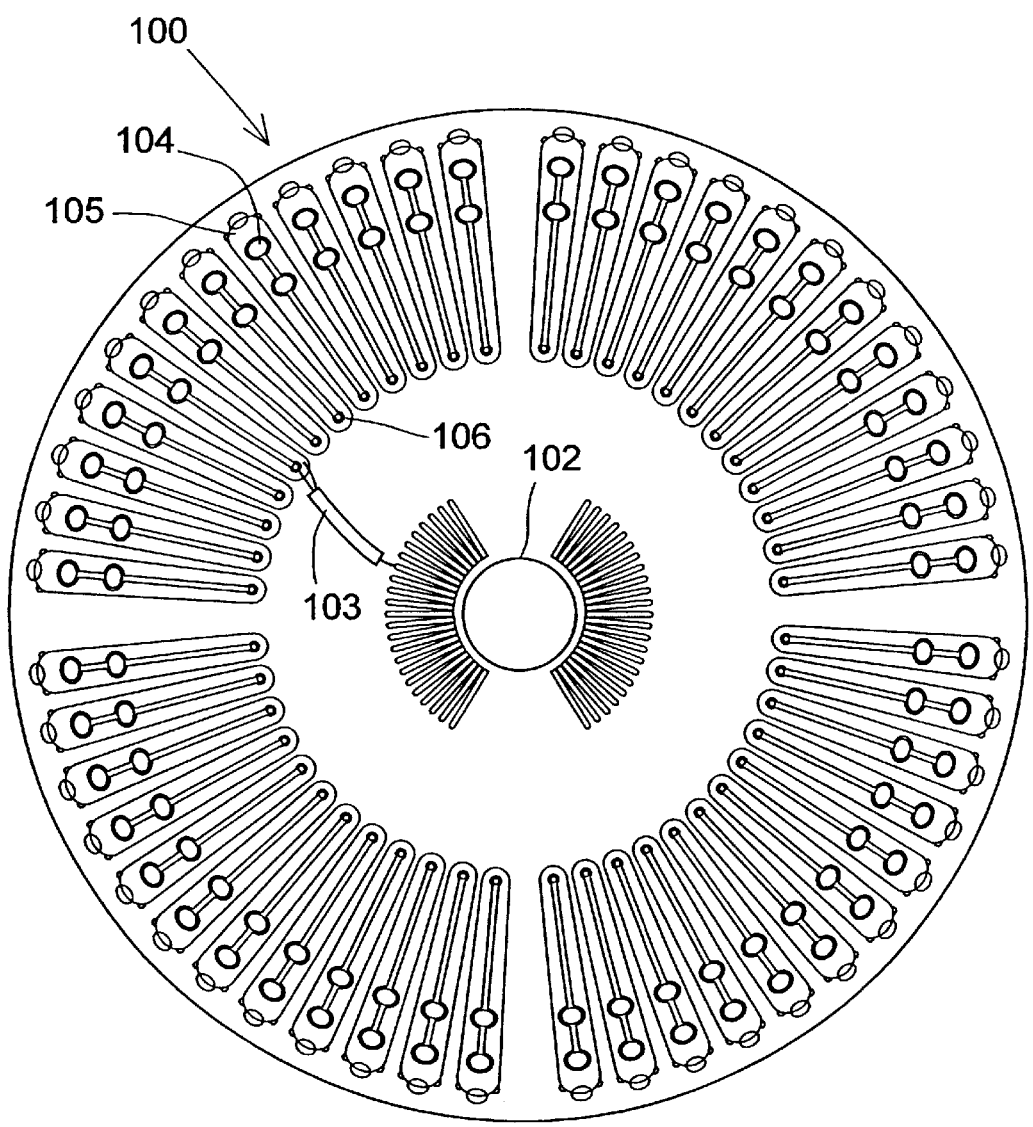
FIG. 10 is a top view of a probe card showing its entire construction.

As described with reference to FIGS. 3 and 4, by providing air gaps around the dielectric carrying the external connection terminal thereon, the capacitance between the external connection terminal and the surrounding conductor can be reduced significantly. Effects of dirt attachment to the surfaces constituting the gaps and humidity and the like may cause the degradation of insulating resistance and dielectric absorption properties. To prevent such undesired effects, the gaps can be sealed. FIGS. 8 and 9 show cross-sections of such structures, respectively. In the structures of FIGS. 8 and 9, an external connection terminal 51 extends up to the inside of the substrate 10. The external connection terminal 51 is supported by a support dielectric 52 embedded in the substrate 10. Gaps 54 are sealed by dielectric layers 53, respectively. In the sealed gaps 54, dry air or inert gas is filled. The external connection terminal 51 is exposed on the substrate surface, and upper guard conductor patterns 55 are formed surrounding the exposed portion. In FIG. 8, support dielectric 52 is in contact with the side and bottom conductor 56, 57. In FIG. 9, support dielectric 52 is in contact with the bottom conductor 57, but is not in contact with the side conductor 56. The structure as shown in FIGS. 8 and 9 is generally similar to the structure or principle of shield wires. Therefore, utilizing such a structure in place of the connection via coaxial cables or shield cables also makes it possible to connect the external connection terminal 51 with a probe needle.

The present invention has been described with reference to the above several embodiments. It is also possible, in specific applications, to substitute the coaxial cable for a single core cable with a high insulating coat typically represented by PTFE (Teflon®) or the like to be used for connection with a probe needle.

The probe card of the present invention as described above can reduce the waiting time due to the dielectric absorption occurring between different electric potentials, and reduce the steady-state leakage current to a negligible level. Moreover, since the insulating body located between different potentials card be shielded by conductors, variations in the microcurrent properties for each probe card or each contact pin member due to the inherent nature of the insulating body or unever manufacturing processes can be prevented.

The entire disclosure of Japanese Patent Application NO. 2000-36626 filed on Feb. 15, 2000 including the specification, claims, drawings and summary are incorporated herein by reference in its entirety.

What I claim is:

1. A probe card comprising:

a substrate;

a support dielectric material disposed in said substrate;

an external connection terminal placed on said support dielectric material;

a conductor layer disposed between said substrate and said support dielectric material at sides and a bottom of said support dielectric material and in substantial contact with both said substrate and said support dielectric material at said bottom of said support dielectric material; and a gap disposed between said support dielectric material and said conductor layer on at least one of said sides of said support dielectric material, separating said support dielectric material and said conductor layer.

2. The probe card of claim 1, wherein said gap is sealed by a dielectric disposed between said support dielectric material and said conductor layer.

3. The probe card according to claim 1, wherein said gap is sealed by dielectric material from outside of said substrate.

* * * * *